(12) United States Patent
Singh et al.

(10) Patent No.: US 12,051,976 B2
(45) Date of Patent: Jul. 30, 2024

(54) DUAL-FOLDED BOOT-STRAP BASED BUCK-BOOST CONVERTER

(71) Applicant: Intel Corporation, Santa Clara, CA (US)

(72) Inventors: Jagadish Vasudeva Singh, Bangalore (IN); Ankur Mishra, Bangalore (IN); Naveen G, Bangalore (IN); Arvind S, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 17/023,203

(22) Filed: Sep. 16, 2020

(65) Prior Publication Data

US 2022/0085718 A1 Mar. 17, 2022

(51) Int. Cl.
*H02M 3/158* (2006.01)
*H03K 17/687* (2006.01)

(52) U.S. Cl.
CPC ...... *H02M 3/1582* (2013.01); *H03K 17/6871* (2013.01)

(58) Field of Classification Search
CPC .......................... H02M 3/1582; H03K 17/6871
USPC .......................................................... 323/271
See application file for complete search history.

(56) References Cited

U.S. PATENT DOCUMENTS

| | | | |
|---|---|---|---|
| 9,484,758 B2* | 11/2016 | Chen ................... | H02M 3/1588 |
| 2011/0080143 A1* | 4/2011 | Parakulam .......... | H02M 3/1584 |
| | | | 323/318 |
| 2013/0214591 A1 | 8/2013 | Miller et al. | |
| 2015/0069956 A1* | 3/2015 | Hu ........................ | H02J 7/007 |
| | | | 320/137 |
| 2019/0199218 A1* | 6/2019 | Kanda ..................... | H02M 3/07 |
| 2020/0091822 A1 | 3/2020 | Ou et al. | |
| 2021/0126538 A1* | 4/2021 | Puia ....................... | H02M 3/158 |

FOREIGN PATENT DOCUMENTS

| | | |
|---|---|---|
| JP | 2004-048830 A | 2/2004 |
| KR | 10-2020-0076903 A | 6/2020 |

OTHER PUBLICATIONS

"Bootstrap Circuit in the Buck Converter", No. 61AN073E Rev. 001. © 2018 ROHM Co., Ltd. Nov. 2018. 5 pages.
"Synchronous Buck Converter Overview", https://microchipdeveloper.com/desanl:synchronous-buck-converter-overview. downloaded on Aug. 24, 2020. 5 pages.
"Understanding battery charger features and charging topologies", https://e2e.ti.com/blogs_/archives/b/fullycharged/archive/2016/09/19/und erstanding-battery-charger-features-and-charging-topologies. Retrieved on Aug. 24, 2020. 4 pages.

(Continued)

*Primary Examiner* — Yemane Mehari
(74) *Attorney, Agent, or Firm* — Schwabe, Williamson & Wyatt, P.C.

(57) ABSTRACT

A buck-boost converter having dual-folded bootstrap for driver metal oxide semiconductor (DrMOS) device that, in addition to the traditional bootstrap capacitors, include folded bootstrap capacitors that cross-couple inductor nodes to the two sets of DrMOS switches. The DrMOS switches can be n-type or p-type, and can be replaced with driver Gallium Nitride (DrGaN) devices.

20 Claims, 5 Drawing Sheets

(56) References Cited

OTHER PUBLICATIONS

Sun, B. et al., "Multimode Control for a Four-Switch Buck-Boost Converter", © Texas Instruments, 2019. ADJ 1Q 2019. 6 pages.
International Search Report and Written Opinion mailed Dec. 6, 2021 for International Application No. PCT/US2021/046155, 10 pages.
International Preliminary Report on Patentability mailed Mar. 30, 2023 for International Application No. PCT/US2021/046155, 7 pages.

* cited by examiner

DUAL-FOLDED BOOT-STRAP BASED BUCK-BOOST CONVERTER

BACKGROUND

External MOSFET (Metal Oxide Semiconductor Field Effect Transistor) based charger designs, due to their lower efficiency and higher thermals, can use up some of the thermal budget of the computer platform that could otherwise be used for performance gain on a SoC (system-on-chip) during AC-power mode. Also, to keep the efficiency high, the frequency of operation is reduced which leads to a larger real-estate and z-height for the solution.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
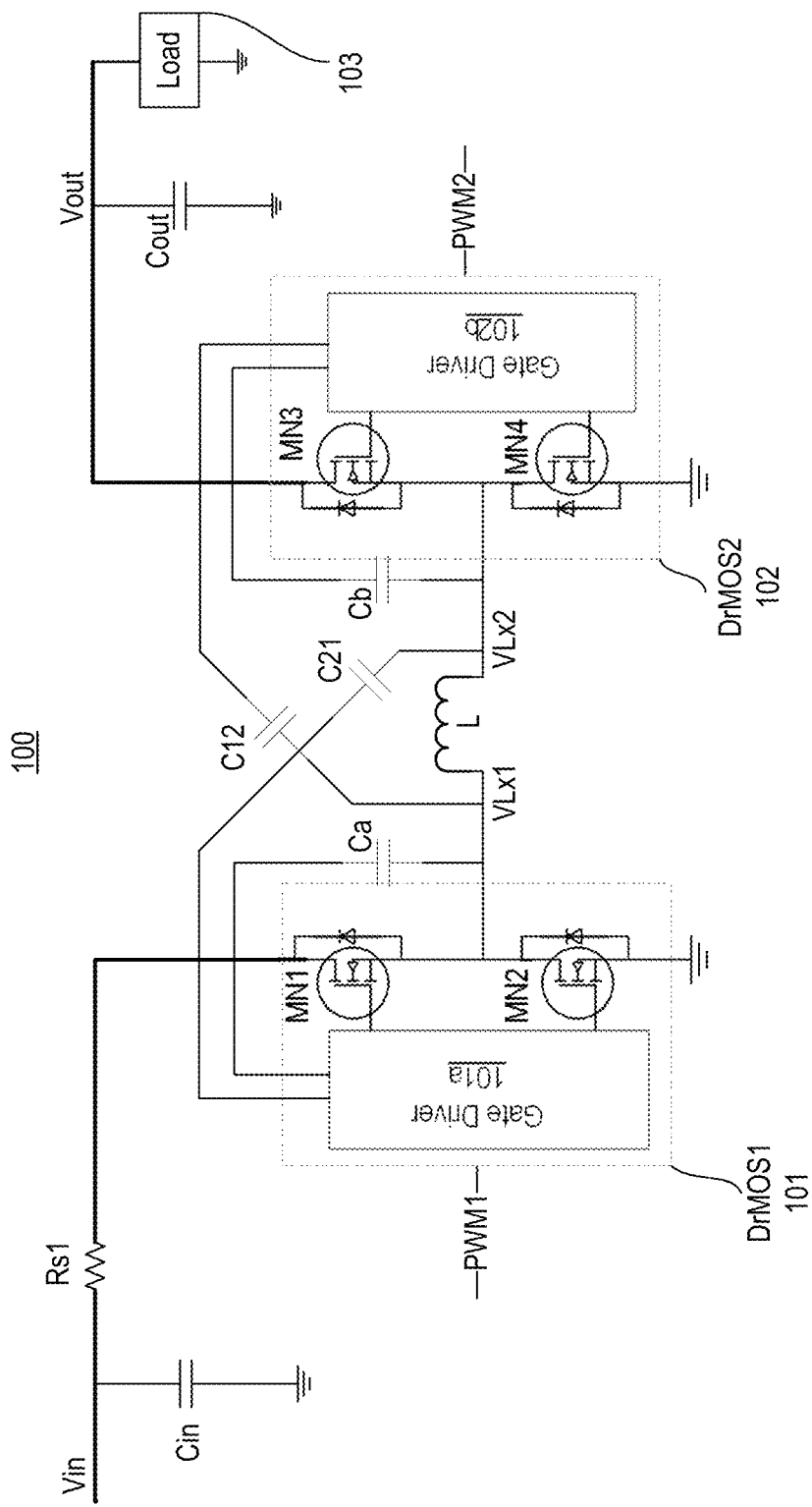
FIG. 1 illustrates a buck-boost converter with cross-sampled inductor nodes, in accordance with some embodiments.

DrMOS refers to a driver and switch module. The switch module can be implemented using metal oxide semiconductor (MOS) transistor, Gallium Nitride based transistor or any other semi-conductor material like SiC, GaAs or diamond and such. In traditional buck-boost converters that use DrMOS devices, only active DrMOS switches generate the high gate drive voltage for high-side transistor through a bootstrap capacitor connected to a switching node and the inductor. The inactive DrMOS device is not able to generate the higher voltage gate drive for its high-side switch. This is because the inactive DrMOS's bootstrap capacitor is connected to a non-switching inductor node.

In some embodiments, a buck-boost converter is provided that comprises DrMOS or DrGaN (switch module with Gallium Nitride) devices used in place of half-bridges for traditional buck-boost converters. Various embodiments here are described with reference to DrMOS. However, the embodiments are also applicable to DrGaN, DrSiC, and/or DrGaAs. The DrMOS devices allow for better efficiency in power conversion due to reduced parasitic and optimized MOSFET packaging. Since the dead-time management is internal to DrMOS, the dead-time management is more accurate than for traditional buck-boost converters leading to higher efficiency in conversion. Higher frequency of operation allows for smaller inductor size, which in turn reduces the z-height of the charger solution comprising the DrMOS based buck-boost converter. The higher operating frequency also allows the reduction of output capacitance requirements which together with the reduced area for the inductor help reduce the real estate for the overall solution.

The improved buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches. There are many technical effects of the various embodiments. For example, the design results in higher efficiency, lower thermal losses, lower z-height and real estate and lesser real estate. Performance of the load (e.g., system-on-chip (SoC)) is improved due to larger available thermal envelope under the same thermal budget when in AC mode. By improving conversion efficiency, the converter can operate at higher frequencies in the same thermal budget for the charger compared to traditional buck-boost converters while reducing the z-height of the inductor in the buck-boost converter. Lower z-height frees more volume allowing for a better thermal solution within the system spatial constraints that further improve performance or provide an opportunity to make the system thinner Lower real estate provides the opportunity to use the area freed up to add more useful features through Application Specific Integrated Circuits (ASICs) or to extend the thermal solution and improve its capability. The improved buck-boost converter achieves thinner and lighter systems while supporting fast-charging, full adapter capability and flexibility using Universal Seral Bus (USB) Type-C compliant power supply for charging. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates buck-boost converter 100 with cross-sampled inductor nodes, in accordance with some embodiments. In various embodiments, buck-boost converter 100 is a four-switch buck-boost converter which is capable of operating where either Vin or Vout or both have very wide range. In some embodiments, buck-boost converter 100 comprises first module 101; second module 102, and an inductor L coupled to the first module 101 and the second module 102. First module 101 receives the input power supply Vin while second module 102 generates the output power supply Vout. The input power supply rail Vin is coupled to an input capacitor Cin while the output power supply rail Vout is coupled to an output capacitor Cout. Load 103 is coupled to Cout. Load 103 can be any suitable load. One such example of load 103 is described with reference to FIG. 5.

Referring back to FIG. 1, first module 101 comprises first driver 101a and first bridge switches MN1 and MN2. Second module 102 comprises second driver 102b and second bridge switches MN3 and MN4. In various embodiments, switch MN1 is a high-side switch of first module 101 while switch MN2 is the low-side switch of first module 101. Likewise, switch MN3 is a high-side switch of second module 102 while switch MN4 is the low-side switch of second module 102. While the switches are illustrated as n-type switches, they can be p-type switches or a combination of n-type and p-type switches.

In various embodiments, first module 101 and second module 102 are driver-switch modules. The switch modules can be implemented using metal oxide semiconductor (MOS) transistor, Gallium Nitride (GaN), or any other semiconductor based transistors. Having the gate drivers next or in close proximity to the respective switches allows for an efficient DC-DC converter topology with lesser losses. While the various embodiments describe the switch modules as DrMOS modules, then can be implemented with GaN switches (also referred to as DrGaN modules) or with SiC, GaAs or any such semi-conductors.

In various embodiments, buck-boost converter 100 converter comprises dual-folded bootstrap capacitors (C12 and C21) and non-folded bootstrap capacitors (Ca and Cb) coupled to the inductor. In some embodiments, the dual-folded bootstrap capacitors comprise a first capacitor C12 having a first terminal coupled to the inductor at node VLx1 and the first bridge switches MN1 and MN2 of first module 101. A second terminal of the first capacitor C12 is coupled to second driver 102b. The dual-folded bootstrap capacitors also include a second capacitor C21 having a first terminal coupled to the inductor at node VLx2 and the second bridge switches MN3 and MN4 of second module 102. A second terminal of the second capacitor C21 is coupled to first driver 101a.

In some embodiments, the non-folded bootstrap capacitors include a third capacitor Ca having a first terminal coupled to the inductor at node VLx1 and the first bridge switches MN1 and MN2 of first module 101, and a second terminal coupled to first driver 101a. In some embodiments, the non-folded bootstrap capacitors include a fourth capacitor Cb having a first terminal coupled to the inductor at node VLx2 and the second bridge switches MN3 and MN4 of second module 102. The second terminal of the fourth capacitor Cb is coupled to second driver 102b.

Here, first module 101 and second module 102 receive their respective switching signals with controllable duty cycles. These switching signals are pulse width modulated (PWM) signals. First driver 101a receives PWM1 signal while second driver 102b receives PWM2 signal.

In various embodiments, MN1 and MN4 are main switches for forward mode buck and boost operations respectively. These switches are controllable by gate driver 101a and 102b that provide switching signal with duty cycle D. Switches MN2 and MN3 are synchronizing switches and controllable by 1-D duty cycle, in accordance with some embodiments. In buck mode of operation, Vin is greater than Vout. In boost mode of operation Vout is greater than Vin.

When Vin is higher than Vout (e.g., in buck mode), MN3 is fully turned on and MN4 is fully turned off. In this case, MN1 and MN2 are controlled by D and 1-D, respectively. When Vin is lower than Vout (e.g., is boost mode), MN1 is fully turned on and MN2 is fully turned off. In this case, MN4 and MN3 are controlled by D and 1-D, respectively. When Vin is close to Vout (e.g., in buck-boost mode), MN1 and MN4 are controlled by D while MN2 and MN3 are controlled by 1-D. In some embodiments, to prevent the modes from bouncing, hysteresis is added between the buck and buck-boost modes and between the buck-boost and boost modes.

For applications that have a wide Vin or Vout range, converter 100 operates in either buck mode or boost mode most of the time. When Vin is close to Vout, converter 101 goes to traditional buck-boost mode, where all four switches MN1, MN2, M3, MN4 are switching. In some embodiments, switching losses are reduced due to lower parasitics and better control over the choice of MOSFETs getting integrated into the DrMOS.

In various embodiments, drivers 101a and 102b are bootstrap drivers. When the low-side switch (e.g., when MN2 or MN4) turns on, the switch node (e.g., VLx1 or VLx2) is pulled to ground. In this case, bootstrap capacitor (Ca or Cb) is charged through a bootstrap resistor and a bootstrap diode from the Vdd power supply. When the low-side switch (e.g., MN2 or MN4) turns off, the energy stored in the bootstrap capacitor (C1 or Cb) becomes a floating bias for the high-side driving circuitry, and is able to drive the high-side switch (e.g., one of MN1 or MN3). In the absence of the dual-folded capacitors C12 and C21, when converter 100 works in buck mode, MN3 need to be fully on (e.g., 100% duty cycle of PWM2) and MN4 needs to be fully off. Then the bootstrap capacitor Cb cannot be charged. In general, gate drivers with charge pump are employed to make the high-side switch fully on and keep the bootstrap capacitor Cb charged.

One way to solve this issue is to use very low switching frequency (e.g., 500 Hz) and drive MN3 with a very small duty cycle. In this case, the turn-on time of MN4 is just enough to charge the bootstrap capacitor Cb to a certain voltage, but MN4 will be otherwise off and MN3 will be on most of the time. The energy stored in the bootstrap capacitor Cb will be able to keep MN3 on for a long period. Since MN4 only turns on and MN3 is turned off) for a very short time (e.g., few nanoseconds), Vout may not see disturbance. However, low PWM frequency for active DrMOS results in large inductor size. Various embodiments allow for higher PWM switching frequencies with lower switching losses using the dual-folded capacitors C12 and C21.

Figure 2:
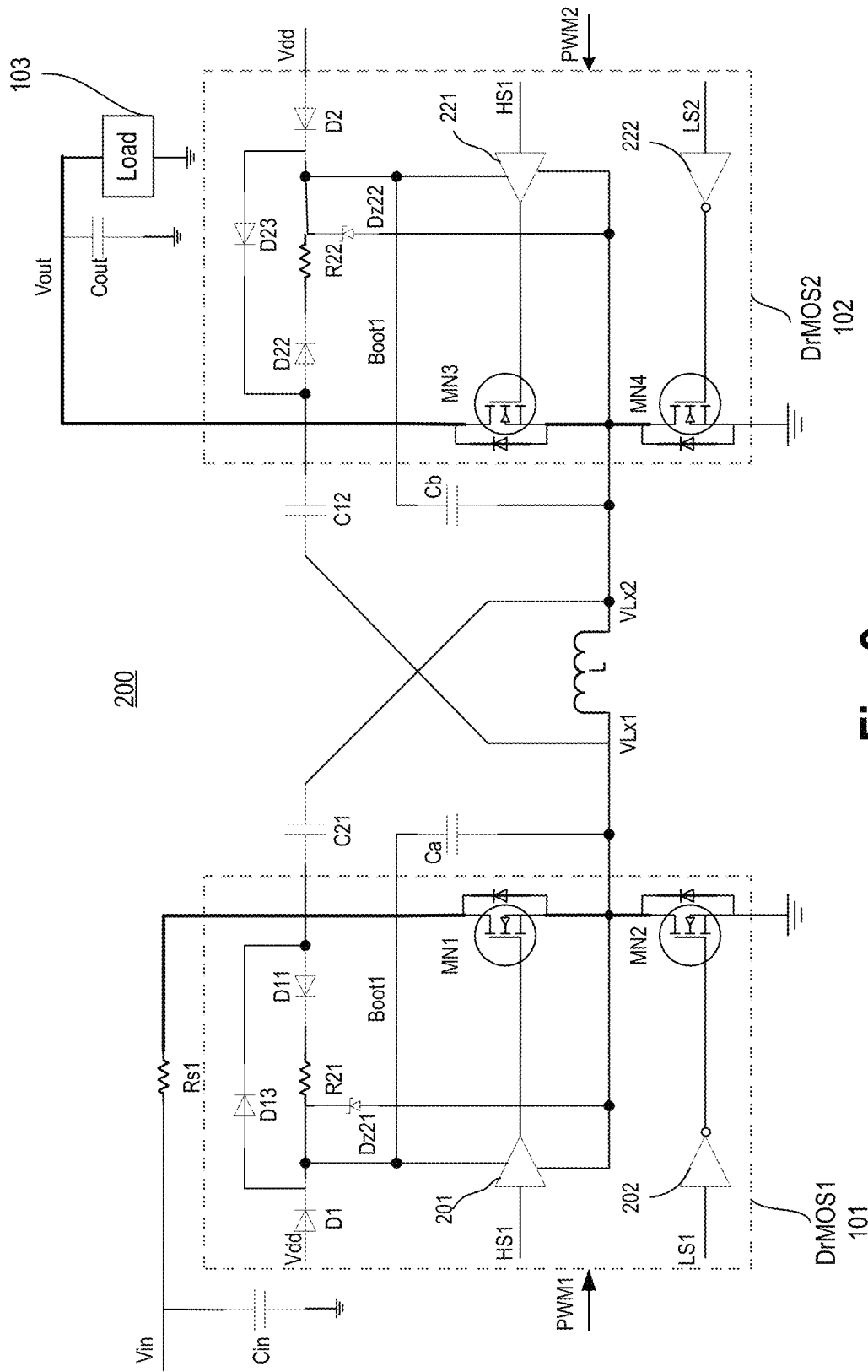
FIG. 2 illustrates a detailed schematic of the buck-boost converter of FIG. 1, in accordance with some embodiments.

FIG. 2 illustrates a detailed schematic 200 of the buck-boost converter of FIG. 1, in accordance with some embodiments. In some embodiments, first driver 101a of first module 101 (DrMOS1) comprises a first inverter or buffer 201 and a second inverter or buffer 202. In some embodiments, first inverter or buffer 201 drives a gate of high-side switch MN1 of the first bridge switches. In some embodiments, second inverter or buffer 202 drives a gate of a low-side switch of the first bridge switches. The implementation of buffer or inverter for drivers 201 and/or 202 depend on the conductivity type of the high-side and low side switches. In some embodiments, first inverter or buffer 201 includes a power supply node coupled to the second terminal of the third capacitor Ca (bootstrap capacitor); and a reference supply node coupled to the first bridge switches (MN1 and MN2) and the inductor L at node VLx1. First inverter or buffer 201 is driven by high-side signal HS1 while second inverter or buffer 202 is driven by low-side signal LS1. Both HS1 and LS1 are derived from PWM1. In some embodiments, HS1 and LS1 can also be controlled and driven directly by the controller. Note, the buffers and/or inverters may be replaced with other logic gates such as NAND gate, NOR gates, and other combinational logic to provide the same function as described with the buffer and or inverter, but with additional control knobs.

In some embodiments, first driver 101a of first module 101 (DrMOS1) comprises a first diode D1 which is coupled to the power supply node of the first inverter or buffer. The anode of first diode D1 is coupled to supply Vdd while the cathode of first diode D1 is coupled to the power supply node of inverter or buffer 201. In some embodiments, first driver 101a of first module 101 (DrMOS1) comprises a second diode D13 coupled to the first diode D1 and the second terminal of the second capacitor C21. The anode of second diode D13 is coupled to the cathode of first diode D1 while the cathode of diode D13 is coupled to the second terminal of second capacitor C21. In some embodiments, first driver 101a of first module 101 (DrMOS1) comprises third diode D11 coupled to the second terminal of the second capacitor C21. In some embodiments, first driver 101a of first module 101 (DrMOS1) comprises a resistor R21 (or resistive device) coupled to the first diode D1, the second diode D13, the third diode D11, and the power supply node of first inverter or buffer 201. Here, the anode of third diode D11 is coupled to second capacitor C21 while cathode of third diode D11 is coupled to a terminal of the resistor R21. In some embodiments, first driver 101a of first module 101 comprises a Zener diode Dz21 coupled to the resistor R21, first diode D1, the second diode D13, and the power supply node of first inverter or buffer 201. The anode of Zener diode Dz21 is coupled to node VLx1 while the cathode is coupled to resistor R21.

In some embodiments, second driver 102b of second module 102 (DrMOS2) comprises a first inverter or buffer 221 and a second inverter or buffer 222. In some embodiments, first inverter or buffer 221 drives a gate of high-side switch MN3 of the second bridge switches. In some embodiments, second inverter or buffer 222 drives a gate of low-side switch MN4 of the second bridge switches. The implementation of buffer or inverter for drivers 221 and/or 222 depend on the conductivity type of the high-side and low side switches. In some embodiments, first inverter or buffer 221 includes a power supply node coupled to the second terminal of the fourth capacitor Cb (bootstrap capacitor); and a reference supply node coupled to the second bridge switches (MN3 and MN4) and the inductor L at node VLx2. First inverter or buffer 221 is driven by high-side signal HS2 while second inverter or buffer 222 is driven by low-side signal LS2. Both HS2 and LS2 are derived from PWM2. In various embodiments, PWM1 and PWM2 are independently controlled depending on the mode of operation of converter 100. In some embodiments, HS1, LS1, HS2 and LS2 are independently controlled depending on the mode of operation of converter 100.

In some embodiments, second driver 102b of second module 102 (DrMOS2) comprises a first diode D2 which is coupled to the power supply node of the first inverter or buffer. The anode of first diode D2 is coupled to supply Vdd while the cathode of first diode D2 is coupled to the power supply node of inverter or buffer 221. In some embodiments, second driver 102b of first module 102 (DrMOS2) comprises a second diode D23 coupled to the first diode D2 and the second terminal of the first capacitor C12. The anode of second diode D23 is coupled to the cathode of first diode D2 while the cathode of diode D23 is coupled to the second terminal of first capacitor C12. In some embodiments, second driver 102b of second module 102 (DrMOS2) comprises third diode D22 coupled to the second terminal of the first capacitor C12. In some embodiments, second driver 102b of second module 102 (DrMOS2) comprises a resistor R22 (or resistive device) coupled to the first diode D2, the second diode D23, the third diode D22, and the power supply node of first inverter or buffer 221. Here, the anode of third diode D22 is coupled to capacitor C12 while cathode of third diode D22 is coupled to a terminal of the resistor R22. In some embodiments, second driver 102b of second module 102 comprises a Zener diode Dz22 coupled to the resistor R22, first diode D2, the second diode D23, and the power supply node of first inverter or buffer 221. The anode of Zener diode Dz22 is coupled to VLx2 while the cathode is coupled to resistor R22. In various embodiments, capacitors C12 and C21 are external to the DrMOS1 101 and DrMOS2 102 modules. In various embodiments, the diodes and resistors are internal to the DrMOS modules.

The capacitors here can be implemented as discrete capacitors, metal-insulation-metal (MIM) capacitors, ferroelectric capacitors, transistor configured as capacitors, metal capacitors, or a combination of them. The resistors here can be implemented as discrete resistors, special devices offered by a process technology node that are configured as resistors, or transistors operating as resistors, or a combination of them. The diodes here can be discrete diodes, transistors configured as diode-connected devices, BPJ devices configured as diodes, or a combination of them.

Figure 3:
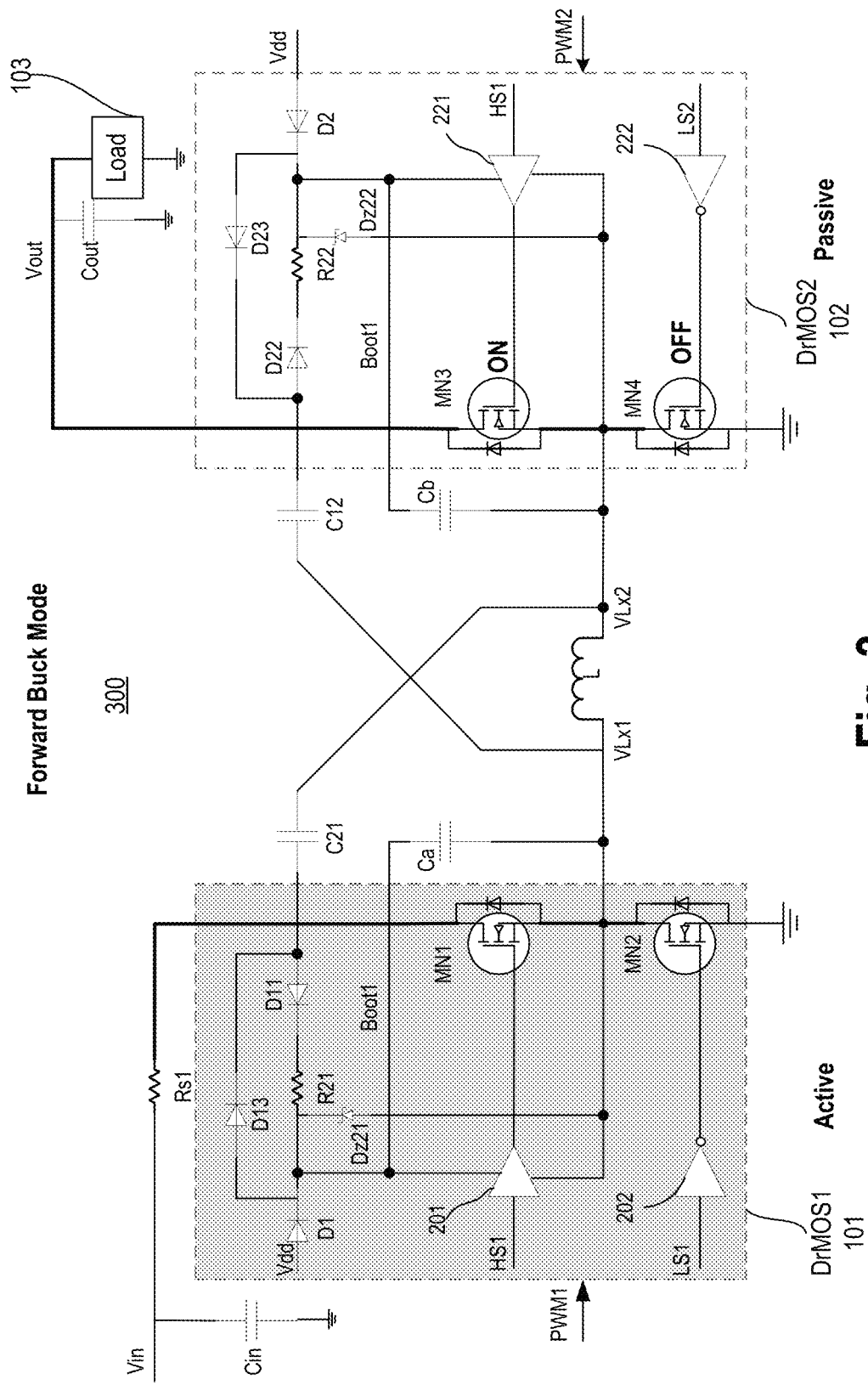
FIG. 3 illustrates the buck-boost converter of FIG. 1 in forward buck mode, in accordance with some embodiments.

FIG. 3 illustrates the buck-boost converter 300 of FIG. 1 in forward buck mode, in accordance with some embodiments. In forward buck model, DrMOS1 101 is active while DrMOS2 102 is inactive (e.g., not switching). Here, PWM1 toggles with a duty cycle D. Any suitable controller (not shown) generates PWM1 signal. In this case, PWM2 is not toggling and its duty cycle is 100%. For example, PWM2 is logically high from a controller, which can be any suitable controller. Transistors MN1 and MN2 are switching FETs that work as the buck converter. Because PWM2 is logically high, MN3 is in ON state while MN4 is in off state.

When DrMOS1 101 is switching, MN2 switch is closed and MN1 switch is open. That will cause the capacitor C12 to charge approximately to Vdd voltage (where Vdd is powered from a charger controller and is less than input voltage Vin). In some embodiments, Vdd is internally generated within the DrMOS module. In various embodiments, Zener diode Dz22 is placed such that it will see a differential voltage with respect to VLx2 node that is enough to turn on MN3. Diode D22 prevents the discharge of capacitor Cb when VLx1 node switches to 0. Diode D23 ensures that diode D22 is forward biased and Zener diode Dz22 cathode is at Vdd supply even if bootstrap capacitor Cb discharges due to leakage current.

When MN2 is open and MN1 is closed, cathode of diode D22 rises to (Vin+Vdd, neglecting diode drop) due to capacitor C12. The choice of Zener diode Dz22 is such that the Vgs of transistor MN3 is never exceeded.

Figure 4:
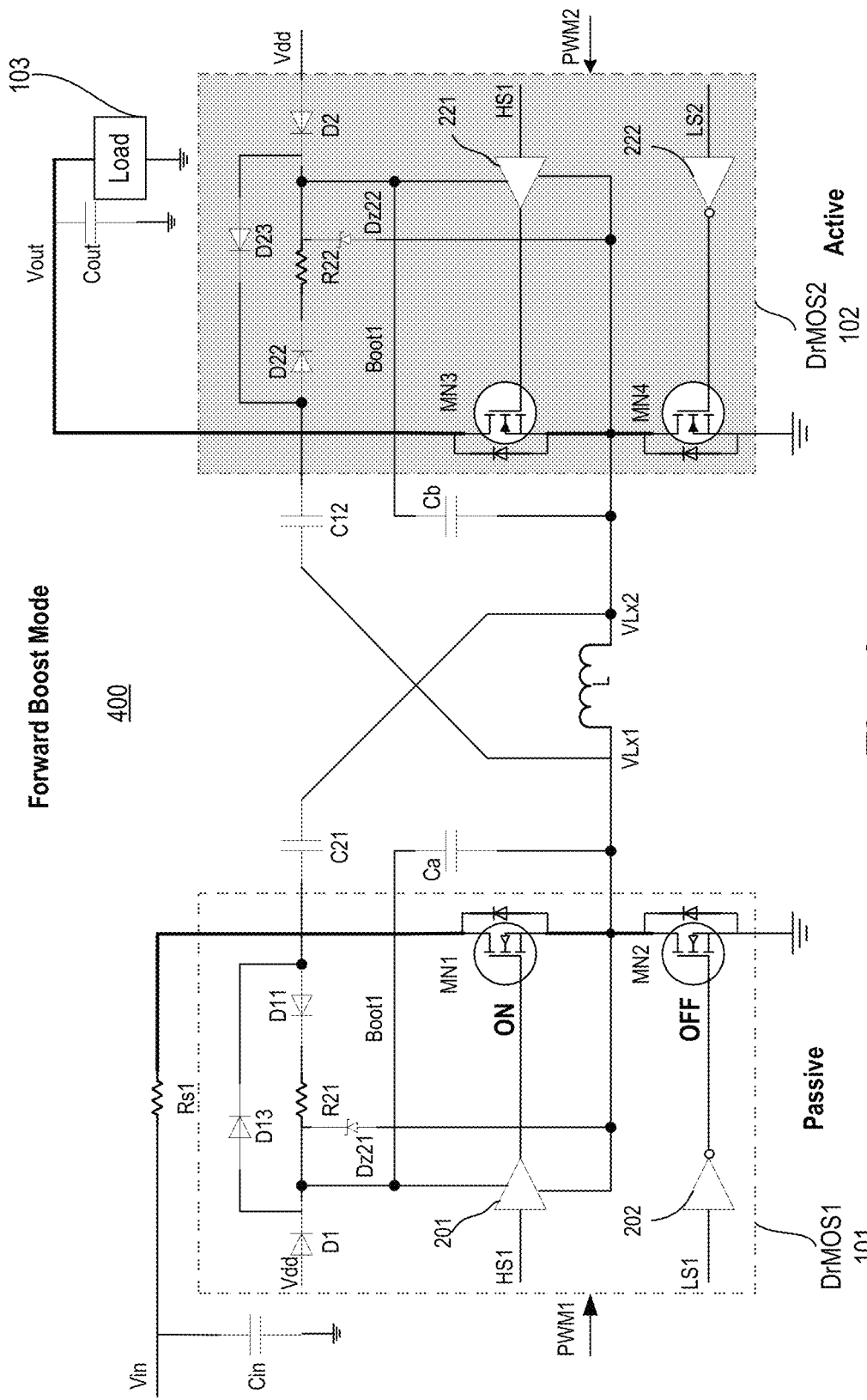
FIG. 4 illustrates the buck-boost converter of FIG. 1 in forward boost mode, in accordance with some embodiments.

FIG. 4 illustrates the buck-boost converter 400 of FIG. 1 in forward boost mode, in accordance with some embodiments. Forward boost mode works similarly to (but inverse) forward buck mode. In forward boost mode, DrMOS1 is passive while DrMOS2 is active. In this case, PWM2 signal is toggling while PWM1 has 100% duty cycle (e.g., kept at logic level high). As such, MN3 and MN4 are switching transistors that work as a boost converter. Transistor MN1 is on while transistor MN2 is off.

When DrMOS2 102 is switching, MN4 switch is closed and MN3 switch is open. That will cause the capacitor C21 to charge approximately to Vdd voltage (where Vdd is powered from a charger controller or can be internally generated with the DrMOS module). In various embodiments, Zener diode Dz21 is placed such that it will see a differential voltage with respect to VLx1 node that is enough to turn on MN1. Diode D11 prevents the discharge of capacitor Ca when VLx2 node switches to 0. Diode D13 ensures that diode D11 is forward biased and Zener diode Dz21 cathode is at Vdd supply even if bootstrap capacitor Ca discharges due to leakage current.

When MN4 is open and MN3 is closed, cathode of diode D11 rises to (Vin+Vdd, neglecting diode drop) due to capacitor C21. The choice of Zener diode Dz21 is such that the Vgs of transistor MN1 is never exceeded.

Figure 5:
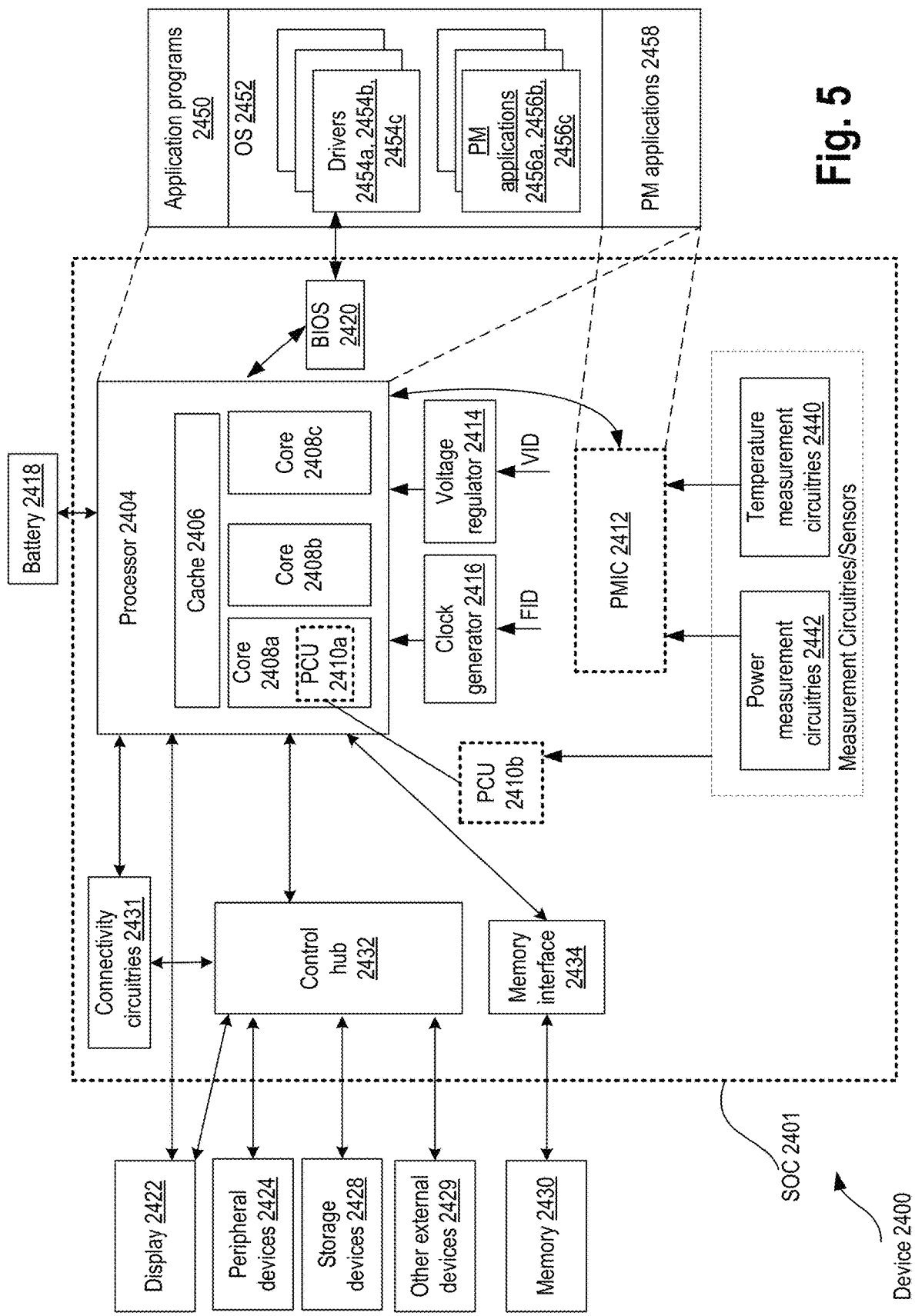
FIG. 5 illustrates a smart device or a computer system or a SoC (System-on-Chip) powered by buck-boost converter with cross-sampled inductor nodes, in accordance with some embodiments.

FIG. 5 illustrates a smart device or a computer system or a SoC (System-on-Chip) powered by buck-boost converter with cross-sampled inductor nodes, in accordance with some embodiments. In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises an SoC (System-on-Chip) 2401. An example boundary of the SoC 2401 is illustrated using dotted lines in FIG. 5, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 5, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity.

In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, VR 2414 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 2414 is completely eliminated (or substantially eliminated) and there is merely a single undershoot transition which could lead to a guaranteed Vmin based on a comparator delay and the di/dt of the load with the available output decoupling capacitance.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter. In some embodiments, battery 2418 includes battery subsystem which comprises battery control and driver MOS (DrMOS) block.

In some embodiments, the charging circuitry (e.g., 2418) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410a/b has a capability to enable extra compute and telemetries resources for the runtime support of the pCode. Here pCode refers to a firmware executed by PCU 2410a/b to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SCO 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

In some embodiments, VR 2414 includes a current sensor to sense and/or measure current through a high-side switch of VR 2414. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1

An apparatus comprising: a first driver and first bridge switches integrated in a first module; a second driver and second bridge switches integrated in a second module; an inductor coupled to the first module and the second module; a first capacitor having a first terminal coupled to the inductor and the first bridge switches of the first module, and a second terminal coupled to the second driver; and a second capacitor having a first terminal coupled to the inductor and the second bridge switches of the second module, and a second terminal coupled to the first driver.

Example 2

The apparatus of example 1 comprising a third capacitor having a first terminal coupled to the inductor and the first bridge switches of the first module, and a second terminal coupled to the first driver.

Example 3

The apparatus of example 2 comprising a fourth capacitor having a first terminal coupled to the inductor and the second bridge switches of the second module, and a second terminal coupled to the second driver.

Example 4

The apparatus of example 3, wherein the first driver of the first module comprises: a first inverter or buffer; and a second inverter or buffer to drive a gate of a low-side switch of the first bridge switches, wherein the first inverter or buffer includes: a power supply node coupled to the second terminal of the third capacitor; and a reference supply node coupled to the first bridge switches and the inductor, wherein the first inverter or buffer drives a gate of a high-side switch of the first bridge switches.

Example 5

The apparatus of example 4, wherein the first driver of the first module comprises: a first diode coupled to the power supply node of the first inverter or buffer; a second diode coupled to the first diode and the second terminal of the second capacitor; a third diode coupled to the second terminal of the second capacitor; and a resistor coupled to the first diode, the second diode, the third diode, and the power supply node of the first inverter or buffer.

Example 6

The apparatus of example 5, wherein the first driver of the first module comprises: a Zener diode coupled to the resistor, first diode, the second diode, and the power supply node of the first inverter or buffer.

Example 7

The apparatus of example 4, wherein the low-side switch comprises an n-type MOS transistor, and wherein the high-side switch comprises an n-type MOS transistor.

Example 8

The apparatus of example 4, wherein the low-side switch comprises an n-type GaN transistor, and wherein the high-side switch comprises an n-type GaN transistor.

Example 9

The apparatus of example 1, wherein the first driver is to receive a first pulse width modulated signal, and wherein the second driver is to receive a second pulse width modulated signal, wherein the first pulse width modulated signal and the second pulse width modulated signal are independently controlled to realize a buck or boost converter.

Example 10

The apparatus of example 1, wherein the first module is coupled to an input power supply rail, and wherein the second module is coupled to an output power supply rail.

Example 11

The apparatus of example 1, wherein the first module is a first DrMOS module, and wherein the second module is a second DrMOS module.

Example 12

An apparatus comprising: a buck-boost DC-DC converter including an inductor, wherein the buck-boost DC-DC converter comprises: a first driver and first bridge switches integrated in a first module; a second driver and second bridge switches integrated in a second module; an inductor coupled to the first module and the second module; and dual-folded bootstrap capacitors coupled to the inductor, the first driver and the second driver.

Example 13

The apparatus of example 12, wherein the dual-folded bootstrap capacitors comprises: a first capacitor having a first terminal coupled to the inductor and the first bridge switches of the first module, and a second terminal coupled to the second driver; and a second capacitor having a first terminal coupled to the inductor and the second bridge switches of the second module, and a second terminal coupled to the first driver.

Example 14

The apparatus of example 13 comprising non-folded bootstrap capacitors coupled to the inductor.

Example 15

The apparatus of example 14, wherein the non-folded bootstrap capacitors include: a third capacitor having a first terminal coupled to the inductor and the first bridge switches of the first module, and a second terminal coupled to the first driver; and a fourth capacitor having a first terminal coupled to the inductor and the second bridge switches of the second module, and a second terminal coupled to the second driver.

Example 16

A system comprising: a charger; a processor coupled to the charger; a memory coupled to the processor; and a wireless interface to allow the processor to communicate with another device, wherein the charger comprises: a buck-boost DC-DC converter including an inductor, wherein the buck-boost DC-DC converter comprises: a first driver and first bridge switches integrated in a first module; a second driver and second bridge switches integrated in a second module; an inductor coupled to the first module and the second module; and dual-folded bootstrap capacitors coupled to the inductor, the first driver and the second driver.

Example 17

The system of example 16, wherein the dual-folded bootstrap capacitors comprises: a first capacitor having a first terminal coupled to the inductor and the first bridge switches of the first module, and a second terminal coupled to the second driver; and a second capacitor having a first terminal coupled to the inductor and the second bridge switches of the second module, and a second terminal coupled to the first driver.

Example 18

The system of example 17 comprising non-folded bootstrap capacitors coupled to the inductor.

Example 19

The system of claim 18, wherein the non-folded bootstrap capacitors include: a third capacitor having a first terminal coupled to the inductor and the first bridge switches of the first module, and a second terminal coupled to the first driver; and a fourth capacitor having a first terminal coupled to the inductor and the second bridge switches of the second module, and a second terminal coupled to the second driver.

Example 20

The system of example 19, wherein the first driver of the first module comprises: a first diode coupled to a power supply node of the first inverter or buffer; a second diode coupled to the first diode and the second terminal of the second capacitor; a third diode coupled to the second terminal of the second capacitor; a resistor coupled to the first diode, the second diode, the third diode, and the power supply node of the first inverter or buffer; and a Zener diode coupled to the resistor, first diode, the second diode, and the power supply node of the first inverter or buffer.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus, comprising:
a first driver comprising a first buffer to drive a first high-side switch and a second buffer to drive a first low-side switch, wherein the first buffer comprises a power supply node;
a second driver comprising a third buffer to drive a second high-side switch and a fourth buffer to drive a second low-side switch;
an inductor having a first node coupled to the first high-side switch and the first low-side switch, and a second node coupled to the second high-side switch and the second low-side switch;
a first capacitor having a first terminal coupled to the first node of the inductor and a second terminal coupled to the third buffer;
a second capacitor having a first terminal coupled to the second node of the inductor and a second terminal coupled to the power supply node of the first buffer;

a third capacitor having a first terminal coupled to the first node of the inductor and a second terminal coupled to the power supply node of the first buffer; and a fourth capacitor having a first terminal coupled to the second node of the inductor and a second terminal coupled to the third buffer.

2. The apparatus of claim 1, wherein the first buffer comprises a reference supply node coupled to the first node of the inductor.

3. The apparatus of claim 1, wherein the first driver comprises:
a first diode coupled to the power supply node of the first buffer;
a second diode coupled to the first diode and the second terminal of the second capacitor;
a third diode coupled to the second terminal of the second capacitor; and
a resistor coupled to the first diode, the second diode, the third diode, and the power supply node of the first buffer.

4. The apparatus of claim 3, wherein the first driver comprises:
a Zener diode coupled to the resistor, the first diode, the second diode, and the power supply node of the first buffer.

5. The apparatus of claim 1, wherein the first low-side switch comprises an n-type Metal Oxide Semiconductor (MOS) transistor, and the first high-side switch comprises an n-type MOS transistor.

6. The apparatus of claim 1, wherein the first low-side switch comprises an n-type Gallium Nitride (GaN) transistor, and the first high-side switch comprises an n-type GaN transistor.

7. The apparatus of claim 1, wherein the first driver is to receive a first pulse-width modulated (PWM) signal, the second driver is to receive a second PWM signal, and the first PWM signal and the second PWM signal are independently controlled to realize a buck or boost converter.

8. The apparatus of claim 1, wherein:
the first driver, the first high-side switch, and the first low-side switch are integrated in a first module;
the second driver, the second high-side switch and the second low-side switch are integrated in a second module;
the first module is coupled to an input power supply rails; and
the second module is coupled to an output power supply rail.

9. The apparatus of claim 1, wherein:
the first driver, the first high-side switch, and the first low-side switch are integrated in a first driver Metal Oxide Semiconductor (DrMOS) module; and
the second driver, the second high-side switch, and the second low-side switch are integrated in a second DrMOS module.

10. A buck-boost direct current (DC)-DC converter, comprising:
a first driver and first bridge switches integrated in a first module, the first bridge switches comprise a first high-side switch and a first low-side switch, the first driver comprises a first buffer to drive the first high-side switch and a second buffer to drive the first low-side switch, and the first buffer comprises a power supply node;
a second driver and second bridge switches integrated in a second module;

an inductor coupled to the first module and the second module; and
dual-folded bootstrap capacitors coupled to the inductor, the first driver, and the second driver, wherein the dual-folded bootstrap capacitors comprise a capacitor having a first terminal coupled to the inductor and a second terminal coupled to the power supply node of the first buffer.

11. The buck-boost DC-DC converter of claim 10, wherein the dual-folded bootstrap capacitors comprise:
a capacitor having a first terminal coupled to the inductor and the first bridge switches, and a second terminal coupled to the second driver.

12. The buck-boost DC-DC converter of claim 11, further comprising non-folded bootstrap capacitors coupled to the inductor.

13. The buck-boost DC-DC converter of claim 12, wherein the first buffer comprises a reference supply node, and the non-folded bootstrap capacitors comprise:
a capacitor having a first terminal coupled to the inductor and to the reference supply node, and a second terminal coupled to the power supply node.

14. A system, comprising:
a charger comprising a buck-boost direct current (DC)-DC converter;
a processor coupled to the charger; and
a memory coupled to the processor;
wherein the buck-boost DC-DC converter comprises:
a first driver and first bridge switches integrated in a first module;
a second driver and second bridge switches integrated in a second module;
an inductor coupled to the first module and the second module, wherein the inductor has a first node coupled to one end of the inductor and a second node coupled to an opposing end of the inductor, the first node is between the one end of the inductor and the first driver, and the second node is between the opposing end of the inductor and the second driver; and
dual-folded bootstrap capacitors coupled to the inductor, the first driver, and the second driver, wherein the dual-folded bootstrap capacitors comprise a first capacitor having a first terminal coupled to the first node of the inductor and a second terminal coupled to the second driver, and a second capacitor having a first terminal coupled to the second node of the inductor and a second terminal coupled to the first driver.

15. The system of claim 14, wherein the first node of the inductor is coupled to the first driver at a point which is between a high-side switch and a low-side switch of the first bridge switches.

16. The system of claim 14, further comprising non-folded bootstrap capacitors coupled to the inductor, wherein the non-folded bootstrap capacitors comprise:
a third capacitor having a first terminal coupled to the first node of the inductor and to a point which is between a high-side switch and a low-side switch of the first bridge switches, and a second terminal coupled to a first buffer to drive the high-side switch of the first driver; and
a fourth capacitor having a first terminal coupled to the second node of the inductor and to a point which is between a high-side switch and a low-side switch of the second bridge switches, and a second terminal coupled to a second buffer to drive the high-side switch of the second driver.

17. The system of claim 16, wherein the first driver of the first module comprises:
- a first diode coupled to a power supply node of the first buffer;
- a second diode coupled to the first diode and the second terminal of the second capacitor;
- a third diode coupled to the second terminal of the second capacitor;
- a resistor coupled to the first diode, the second diode, the third diode, and the power supply node of the first buffer; and
- a Zener diode coupled to the resistor, the first diode, the second diode, and the power supply node of the first buffer.

18. The apparatus of claim 1, wherein:
- the first node of the inductor is coupled to a node which is between the first high-side switch and the first low-side switch; and
- the second node of the inductor is coupled to a node which is between the second high-side switch and the second low-side switch.

19. The apparatus of claim 1, wherein the third buffer comprises a power supply node coupled to the second terminal of the first capacitor and to the second terminal of the fourth capacitor, and a reference supply node coupled to the second node of the inductor.

20. The system of claim 15, wherein the second node of the inductor is coupled to the second driver at a point which is between a high-side switch and a low-side switch of the second bridge switches.

* * * * *

UNITED STATES PATENT AND TRADEMARK OFFICE
CERTIFICATE OF CORRECTION

PATENT NO. : 12,051,976 B2
APPLICATION NO. : 17/023203
DATED : July 30, 2024
INVENTOR(S) : Jagadish Vasudeva Singh et al.

It is certified that error appears in the above-identified patent and that said Letters Patent is hereby corrected as shown below:

In the Claims

Column 21
Line 43, "...the second high-side switch and the" should read --...the second high-side switch, and the--
Line 46, "...an input power supply rails;" should read --...an input power supply rail;--

Signed and Sealed this
First Day of October, 2024

Katherine Kelly Vidal
*Director of the United States Patent and Trademark Office*